(12) United States Patent  
Huang

(10) Patent No.: US 7,007,222 B2  
(45) Date of Patent: Feb. 28, 2006

(54) APPARATUS FOR ACCESSING DATA STORED ON AN OPTICAL DISC

(75) Inventor: Wei-Hung Huang, Hsinchu (TW)

(73) Assignee: MediaTek Inc., Hsinchu (TW)

( * ) Notice: Subject to any disclaimer, the term of this patent is extended or adjusted under 35 U.S.C. 154(b) by 0 days.

(21) Appl. No.: 10/678,587

(22) Filed: Oct. 3, 2003

(65) Prior Publication Data

US 2004/0068688 A1    Apr. 8, 2004

Related U.S. Application Data

(63) Continuation of application No. 09/491,201, filed on Jan. 25, 2000, now Pat. No. 6,662,335.

(30) Foreign Application Priority Data

Dec. 4, 1999    (TW) ............................... 88121259 A

(51) Int. Cl.  
    *H03M 13/00*    (2006.01)  
    *G11C 29/00*    (2006.01)

(52) U.S. Cl. ..................................... 714/755; 714/770

(58) Field of Classification Search ................ 714/755, 714/756, 769, 770  
See application file for complete search history.

(56) References Cited

U.S. PATENT DOCUMENTS

| 4,649,541 | A | * | 3/1987 | Lahmeyer ..................... 714/784 |
| 5,404,248 | A | * | 4/1995 | Shimoda et al. ............... 360/48 |
| 5,719,884 | A | * | 2/1998 | Roth et al. ................... 714/755 |
| 6,662,335 | B1 | * | 12/2003 | Huang ......................... 714/769 |

* cited by examiner

*Primary Examiner*—Joseph Torres  
(74) *Attorney, Agent, or Firm*—J.C. Patents

(57) ABSTRACT

An apparatus for accessing DVD data is provided. In the apparatus for accessing the data of a DVD, a row data buffer and an error detection code file are added. The row data buffer stores the row data from the row data interface, and the error detection code file records the error detection code stored in the memory. When an error occurs in the error detection code, the error detection code in the error detection code file may be modified. In addition to the normal data access, the method of accessing DVD data only re-access when a certain error occurs during RSPC decoding.

6 Claims, 9 Drawing Sheets

172 BYTES / 192 ROWS $b_{0,0}$, $b_{0,1}$, ..., $b_{0,170}$, $b_{0,171}$
$b_{1,0}$, $b_{1,1}$, ..., $b_{1,170}$, $b_{1,171}$
...
$b_{190,0}$, $b_{190,1}$, ..., $b_{190,170}$, $b_{190,171}$
$b_{191,0}$, $b_{191,1}$, ..., $b_{191,170}$, $b_{191,171}$

FIG. 2A (PRIOR ART)

172 BYTES / 192 ROWS / PO 16 ROWS $b_{0,0}$, $b_{0,1}$, ..., $b_{0,170}$, $b_{0,171}$
$b_{1,0}$, $b_{1,1}$, ..., $b_{1,170}$, $b_{1,171}$
...
$b_{190,0}$, $b_{190,1}$, ..., $b_{190,170}$, $b_{190,171}$
$b_{191,0}$, $b_{191,1}$, ..., $b_{191,170}$, $b_{191,171}$
$b_{192,0}$, $b_{192,1}$, ..., $b_{192,170}$, $b_{192,171}$
...
$b_{207,0}$, $b_{207,1}$, ..., $b_{207,170}$, $b_{207,171}$

FIG. 2B (PRIOR ART)

APPARATUS FOR ACCESSING DATA STORED ON AN OPTICAL DISC

CROSS-REFERENCE TO RELATED APPLICATION

This application is a continuation application of U.S. patent application titled "METHOD AND APPARATUS FOR ACCESSING DVD DATA" filed on Jan. 25, 2000 U.S. Pat. No. 6,662,335, Ser. No. 09/491,201, now allowed. All disclosures of the application are incorporated herein by reference.

BACKGROUND OF THE INVENTION

1. Field of the Invention

The invention relates in general to an apparatus for accessing data stored in a storage medium. More particularly, this invention relates to, an apparatus for accessing data stored on an optical disc.

2. Description of the Related Art

In recent years, the CD-ROM storage system has been speedily developed in both application and techniques. In terms of operation speed, from the early model of single speed, the current model has been developed with more than fifty times of the single speed. The capacity has also been increased from 650 Mega-byte to 4 Giga-Byte. Nowadays, the DVD plays a more and more important role. Currently, the DVD-ROM has approached a quad-speed. According to the development of CD-ROM, a DVD-ROM with a much higher speed is foreseeable. In addition to the operation speed, the performance of a DVD-ROM includes the capability of data accessing. That is, when the disk contains scratches or other defects, the DVD-ROM can still access the data of the disk precisely.

A brief description for accessing data of a DVD is introduced as follows.

In a DVD, an original data of 2048 bytes are stored in a data sector. FIG. 1 displays the format for storing data in each of the data sector. From FIG. 1, each data sector comprises twelve rows of data. ID 102 having a length of 4 bytes is a number sequentially increasing according to the order of the data sectors. The identification error detection code (IEDC) 104 having a length of 2 bytes is used as data protection of the ID 102. The copyright management information ($CPR_{13}MAI$) 106 with a length of 6 bytes is used to store the data related to copyright. The main data with a total length of 2048 bytes is shown in FIG. 1 as well. After the scramble operation of ID 102, the main data are stored in the main data segment 108, 110, 112, 114–426, 128 to 130 in sequence.

In addition to store data of 160 bytes in the main data segment 108, and to store data of 168 bytes in the main data segment 130, each of the rest of the main data segments from 110, 112, 114–426 to 128 stores data of 172 bytes. A sum of these data stored in the main data segments 108, 110, 112, 114–126, 128 to 130 is 2048 bytes ($D_0$–$D_{2047}$).

In the last row of FIG. 1, that is, the row comprises the data segment 130, there is an error detection code (EDC) 132 with a length of 4 bytes. This error detection code 132 is obtained according to the data of 2060 bytes stored in the ID 102, the IDEC 104, the CPR_MAI 106 and the main data segments 108 to 130. Therefore, the total length of a data sector is 2064 bytes.

To protect the data stored in a data sector, in a DVD, 16 data sectors, that is, 192 rows of data are treated as a unit encoded into an ECC block according to Reed Solomon Product Code (RSPC). As shown in FIG. 2A, data of 192 rows times 172 bytes, that is, data $b_{0,0}$ to $b_{191,\,171}$ are assembled according to the sequence of the data in the data sector. Referring to FIG. 2B, each of the 172 data columns is encoded by RS(208, 192, 17) according to RSPC, so that an outer-code parity (PO) data with a length of 16 bytes is added to each column as the 16 column of PO data $b_{192,\,0}$ to $b_{207,\,171}$.

After generating the PO data, the whole sector of data is shown as FIG. 2C. The whole sector comprises 208 rows of data, and each row of data is encoded by RS(182, 172, 11) to add inner-code parity (PI) data with a length 10 bytes in each column, that is, the data $b_{0,\,172}$ to $b_{0,\,181}$ to the data $b_{207,\,172}$ to $b_{207,\,181}$. The added PI data comprises data of 208 rows times 10 bytes. The ECC block is thus assembled.

FIG. 2D shows the data storage configuration in a DVD disk. As shown in the figure, in the end of each data sector, a segment of PO data is added, while the PI data are added right after each row of the data sector. For example, after each of the twelve rows of the $0^{th}$ data sector 210, a 10 byte PI data is added. After the $0^{th}$ data sector 210 and before the first data sector 220, a $PO_0$ data 215 is added. It is similar to the first sector 220, the second sector 230 until the $15^{th}$ sector 240. A $PO_1$ data 225, a $PO_2$ data 235 . . . , a $PO_{15}$ data 245 are respectively added between the data sectors 220, 230, . . . and, 240.

FIG. 3A shows a structure for accessing data of a DVD, and FIG. 3B shows a flow chart for accessing data of the DVD. In FIG. 3A, an analog signal read from the disk 310 by the reading head 311 is converted into a digital EFM data 313 by an analog signal processor 312. Being demodulated by the EFMPLUS demodulator 314, the EFM data 313 becomes the row data 315 in a unit of bytes. According to the ID of the row data 315, the row data interface 316 stores the required sector data to the memory 321 under the control of the memory controller 320. While the data stored into the memory 321 by the row data interface 316 can be assembled as an ECC block, the RSPC decoder 317 accesses the data stored in the memory 321 via the memory controller 320 to decode of PI data and PO data, so as to correct the error data.

Each time when the RSPC decoder 317 finishes decoding PI data and PO data in an ECC block, the error detection code processor 318 accesses the data stored in the memory 321 via the memory controller 321. The error detection code in each sector of the 16 data sectors in the ECC block is calculated. If all the error detection codes are correct, the host interface 319 descrambles and send the main data to the host 322. If any of the 16 error detection codes is incorrect, there are two ways to process. One is to repeat decoding the PI and PO data by the RSPC decoder 317 once, followed by re-calculating the new error detection codes by the EDC processor 318 until all the error detection codes are correct. The other way is to access the ECC block by re-read the disk 310 by the reading head 311. Through the same flow, the error detection codes are re-calculated until all the error detection codes are correct.

According to the above description, the accessing times for memory 321 can be obtained from the flow chart of FIG. 3B. In step S330, after performing the EFMPLUS demodulation, the required sequential steps comprise: writing data into the memory 321 by the row data interface 316 in step S331; decoding PI data and PO data using RSPC decoder 317 and performing correction in steps S332 and S333; calculating the error detection codes in step S334; and sending the data to the host 322 in step S335. Thus, the steps to access the memory 321 comprise writing the memory 321 in step 331; reading the memory 321 in steps S332, S333, S334 and S335; and correcting the memory in steps S332 and S333.

Therefore, a calculation for the flow of the data can be presented as:

Each time when reading in an ECC block, a total amount of (192+16)×(172+10)=38038 bytes is to be written into the memory (as shown in FIG. 2C).

In step S332, while decoding the PI data, an amount of (192+16)×(172+10)=38038 bytes are to be read.

In step S333, while decoding the PO data, an amount of (192+16)×172=35776 bytes are to be read.

In step S334, while calculating the error detection codes, 16 data sectors are to be read. Each data sector is of 2064 bytes, so that the total amount is 16×2064=33024 bytes.

When sending the data to the host 322 in step S335, the required-amount of the data is 16×2048=32768 bytes.

In step S332 and S333, as the accessed memory for correction of the PI data and PO data is negligible, therefore, the amount is not calculated.

According to the above calculation, when the host obtains the data of 16×2048 (that is, 32768) bytes, at least 177624 bytes of the memory are accessed. By the definition of DVD specification, a single speed for data transferring of a DVD is 1.385 Mbytes/sec. That is, for a single speed, the data accessing amount for the memory is 1.385×177624/32768=7.507 Mbytes/sec. Therefore, when the DVD approaches twelve times of speed, the data accessing speed is 90 Mbytes/sec, and it is 120 Mbytes/sec for a sixteen times speed.

With regard to the design of DVD, a memory with a length of a 16 bit data bus is used as the memory 321 as shown in FIG. 3A. Since the length of the data bus is 16 bit, so that 2 bytes can be accessed each time. In addition, while accessing each set of memory data, for an SDRAM, a clock cycle has to be exceeded. Therefore, for a 16 times speed DVD-ROM, according to the conventional design, an SDRAM of 120 MHz is required. The memory with a higher frequency connotes a higher cost and larger power consumption. In addition, as the signal is in high frequency, the difficulty of system design is increased.

Thus, the conventional design for accessing data of DVD comprises the following drawbacks:

1. The access amount for memory is massy to affect the speed for accessing data of DVD. As the high frequency devices are required, the cost is increased, and the power consumption is raised. Furthermore, it is difficult to design;

2. The method for correcting the errors of error detection code during decoding consumes a lot of resources by re-reading. For re-decoding procedure, the over-all speed for accessing the data of DVD is also degraded. Therefore, it cannot meet the high speed requirement.

SUMMARY OF THE INVENTION

The invention provides an apparatus for accessing data stored on an optical disc. The total number of times required for accessing memory data is reduced. In addition, partial data is decoded again to increase the efficiency of data access is enhanced.

The invention provides an apparatus for accessing data stored on an optical disc. The apparatus comprises a row data interface, a row data buffer, a first inner-code decoder, an error detection code generator, and an error detection code file. The row data interface is used to store a row data to another data storing section. The row data buffer is to store the row data from the row data interface. In addition, when the row data in the row data buffer can be assembled as an inner-code parity code, the first inner-code decoder decodes the inner-code parity code, so as to generate an inner-code decoding data. When the inner-code decoded data is the data required for generating an error detection code, the inner-code decoded data is sent to the EDC generator for generating the error detection code.

In addition, after the error detection code generator receives the inner-code decoding data, and after calculating the error detection code, the error detection code is stored in the memory. The error detection code file records the error detection code stored in the memory, and corrects the error detection code in the error detection code file while an error occurs.

The invention further provides an apparatus for accessing data stored on an optical disc. The reading apparatus of the DVD is waiting for a reading command. While receiving the reading signal, a data sector to be read is found according to the reading signal. While the data sector is under a re-reading state, and while an error detection code of the data sector is under a correct state, the data sector is skipped. On the contrary, while the data sector is not under a re-reading state, or the error detection code of the data sector is under an incorrect state, a routine process is performed on the data sector.

After skipping the data sector, or after the routine process, whether the data sector is the last sector of the ECC block is determined. If the data sector is not the last sector, the data of the data sector subsequent to the current data sector is processed. If the data sector is the last sector, the re-reading state is relieved.

From the above description, by adding a buffer, the number of times required for accessing data of a memory is reduced. Therefore, the DVD data can be accessed with a lower operation frequency memory. In addition, the invention decodes only the data sector with an error, so that the efficiency of data accessing is enhanced.

Both the foregoing general description and the following detailed description are exemplary and explanatory only and are not restrictive of the invention, as claimed.

BRIEF DESCRIPTION OF THE DRAWINGS

FIGS. 2A to 2D shows data formation process in an ECC block;

DESCRIPTION OF THE PREFERRED EMBODIMENTS

Figure 4A:
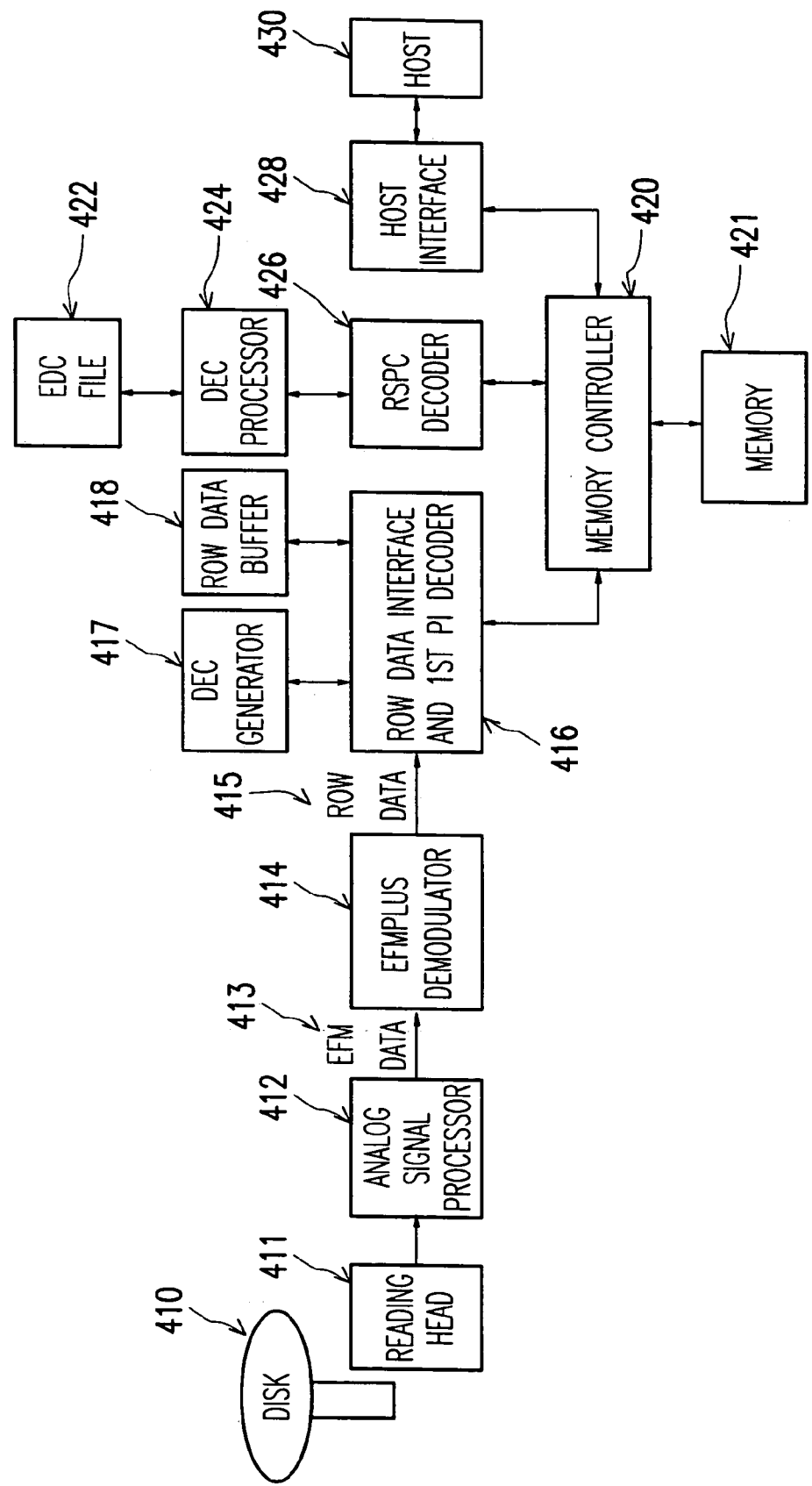
FIG. 4A shows a hardware structure for accessing DVD data in an embodiment according to the invention.

FIG. 4A shows an embodiment of a hardware structure for accessing DVD data according to the invention. In FIG. 4A, an analog signal read from the disk 410 by a reading head 411 is converted into a digital EFM data 413 by an analog signal processor 412. The EFM data is demodulated by an EFMPLUS demodulator 414 into a row data 415 in a unit of bytes.

The row data 415 is stored into a row buffer 418 via a row data interface and first inner-code decoder 416. When the data stored in the row buffer 418 can be assembled into a set of inner-code parity, an inner-code parity decoding operation is performed on the set of data by the row data interface and first inner-code decoder 416. A set of inner-code data is obtained by this decoding step. The set of inner-code decoded data is stored into the memory 421.

When the set of inner-code decoded data is stored into the memory 421, if the set of inner-code decoded data is the data required for generating an error detection code, the set of inner-code decoding data is also sent to the EDC generator 417. The error detection code for this data sector is thus generated. Each time when the data of the whole data sector is stored into the memory 421, the error detection code generated by the error detection code generator 417 is also stored into the memory 421 to be used by RSPC decoder 426.

When the data stored in the memory 421 can be assembled as a complete data block, the RSPC decoder 426 reads the error detection codes of the 16 data sectors, which are processed by the row data interface and first inner-code decoder 416 from the memory 421 under the control of the memory controller 420. By the error detection correction (EDC) processor 424, these error detection codes are stored into the EDC file 422. The RSPC decoder 426 then reads any of the outer-code parity data and performs outer-code parity decoding. When an error occurs in the outer-code parity decoding process, the data stored in the memory 421 is updated. In addition, incorporating the results of error correction disclosed in U.S. patent application Ser. No. 08/823,423, which is later issued as U.S. Pat. No. 6,003,151 and assigned to the same applicant, the error detection codes of the data sector corresponding to the EDC file 422 is corrected.

After the RSPC decoder 426 decodes decoding all the outer-code parity, the host interface 428 inspects whether the error detection codes in the error detection code file 422 corresponding to the 16 data sectors are correct. If the error detection codes are correct, the data stored in the memory 421 is sent to the host 430.

Figure 4B:
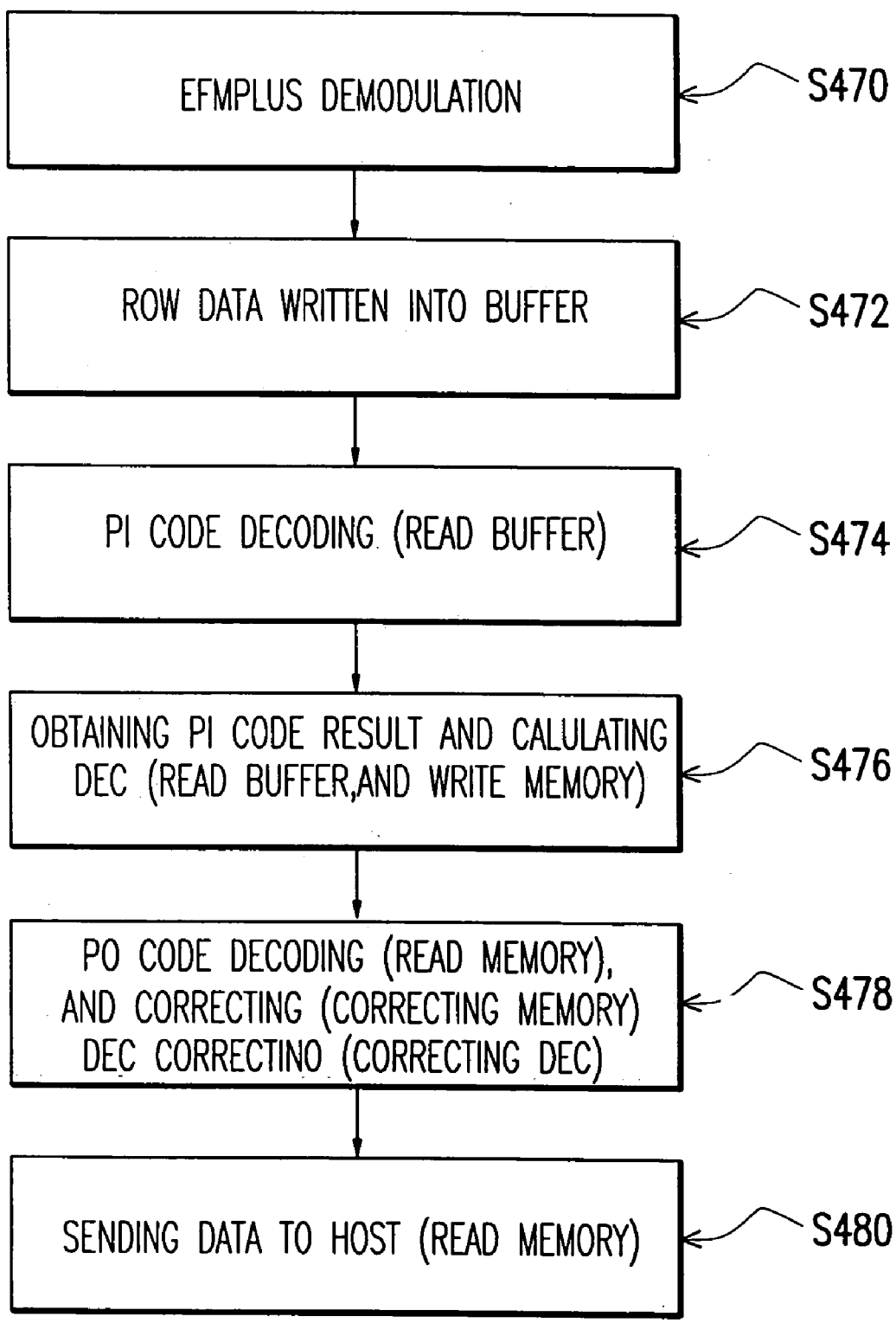
FIG. 4B is a flow chart showing the process of accessing the DVD data using the structure as shown in FIG. 4A.

Referring to FIG. 4B, a flow chart of a method to access DVD data is illustrated. The method is introduced with the reference of both FIG. 4A and FIG. 4B as follows. After being read, the EFM data is demodulated into row data 415 by the EFMPLUS demodulator 414 is step S470. In step S472, the row data interface 416 writes the row data 415 into the row data buffer 418. In step S474, the row data is read from the row data buffer 418. After performing an inner-code parity decoded in the first inner-code decoder 416, an inner code decoding data is obtained.

In step S476, after obtaining the inner-code decoded data, the error detection code is calculated by the error detection code generator 417. The data are then stored into the memory 421. In step S478, the data stored in the memory 421 is then read, followed by outer-code parity decoding by the RSPC decoder 426, a correction is performed on the data in the memory 421 and the error detection codes in the error detection code file 422. In step S480, after correction, the corrected data is sent to the host 430.

The amount of data access for a memory in an ECC block is calculated as follows.

In step S476, the data written into the memory comprises 38038 bytes plus 16×4 bytes (each of the error detection code has 4 bytes). Totally, the length of the data written into the memory is 38028+64=38092 bytes.

In step S478, the access data required to be read outer-code parity decoding is 172×208=35776 bytes.

In step S480, the data required to be accessed for sending data to the host is 16×2048=32768 bytes.

Thus, for each ECC block, the data required to be accessed has a length of 38092+35776+32768=106636 bytes. Compared to the conventional structure, only 60% of the data flow is used. Therefore, for a 16 speed DVD with a conventional structure, a SDRAM of 120 MHz is required, while only a SDRAM of 72 MHz is used in the structure provided by the invention.

It is worth noting the size of the row data buffer 418 and the error detection code file 422. Since only 16 sets of error detection codes are stored in the error detection code file 422, only 64 bytes are required. To ensure that the row data can be transferred continuously during the inner-code parity decoding procedure, a space for two inner-code parity codes of 364 bytes is required. Since these two regions are not large, it can be achieved by building an SRAM into the DVD integrated circuit.

Figure 5:
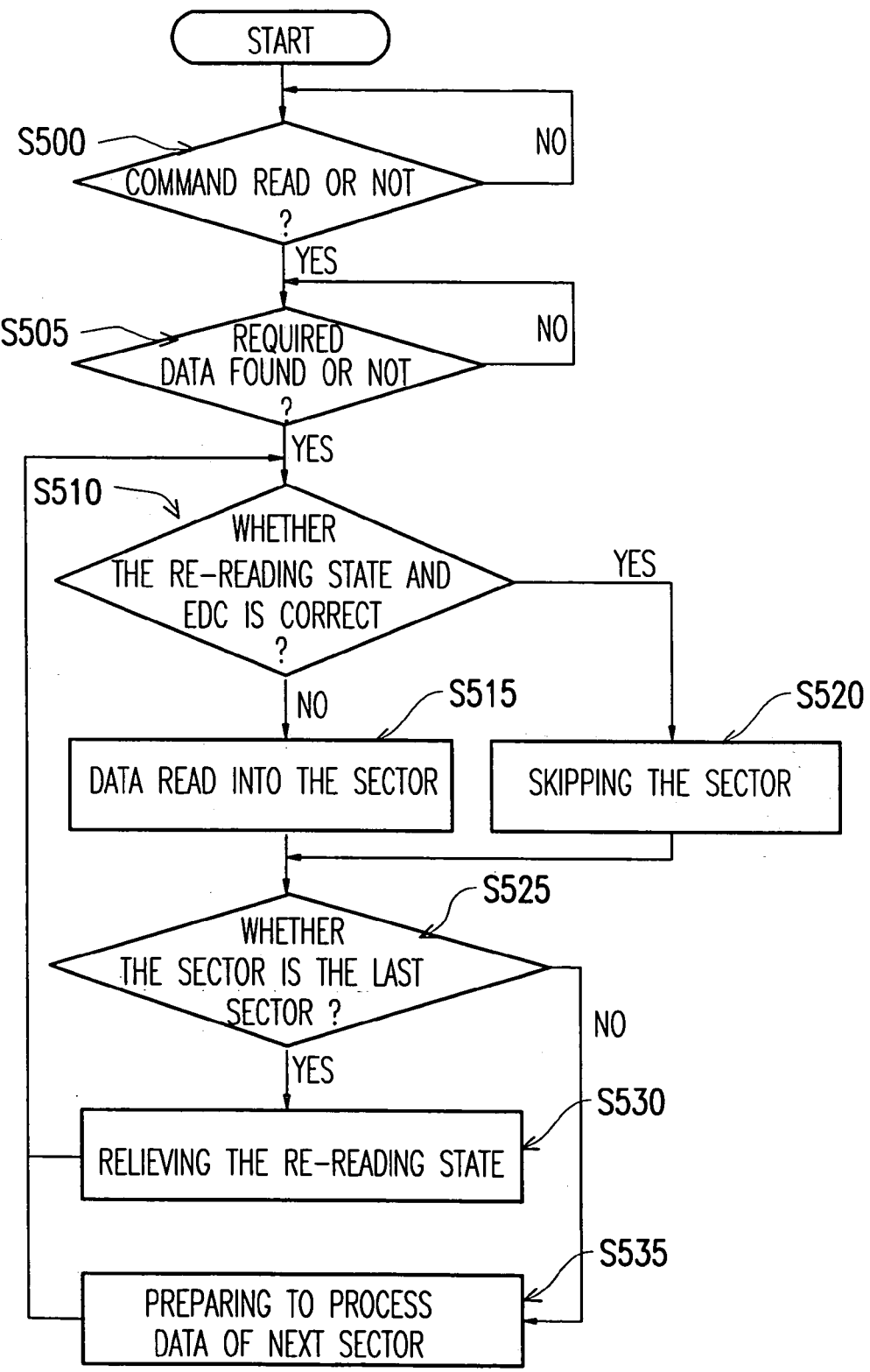
FIG. 5 shows a flow chart of a method for accessing DVD data.

FIG. 5 shows another flow chart of the method for accessing DVD data. In step S500, the flow starts only while a read command is received. The read signal includes data such as the ID of the data sector to be read initially. Whether a repeating reading flag for data reading due to an error in the error detection code is also included. In step S505, according to read signal, the data sector to be read is found. In the embodiment, whether the currently read data sector is the required one is determined by monitoring the row data from the row data interface. When the ID of the row data is identical to the ID of the data sector to be read, the read data sector is determined as the required one.

At the step S510, if the read data sector is under a re-reading state, and the error detection codes of the data sector read current are correct, being controlled, the currently read data sector is skipped at the step S520. If the currently read data sector is not under a re-reading state, or the error detection codes are not correct, the data sector is read at the step S515, and a routine process is performed on the current read data sector. The so-called "routine process" is the procedure to write data and to send the data to the host.

In step S520, the currently read data sector is skipped, or after the step S515 that the routine process is performed, step S525 determines whether the read data sector is the last sector of the ECC block. That is, whether the flag of the ID representing the read data sector is 15 (each ECC block contains 16 data sectors of ID 0–15). If it is not the last sector, the flag is added with 1 in step S535. A data sector subsequent to this data sector is processed. On the contrary, at the step S530, if this is the last sector of the ECC block, it indicates that the subsequent data to be read is the data of another ECC block. Thus, in step S535, the flag is set as 0 to access the data of the next ECC block.

Figure 1:
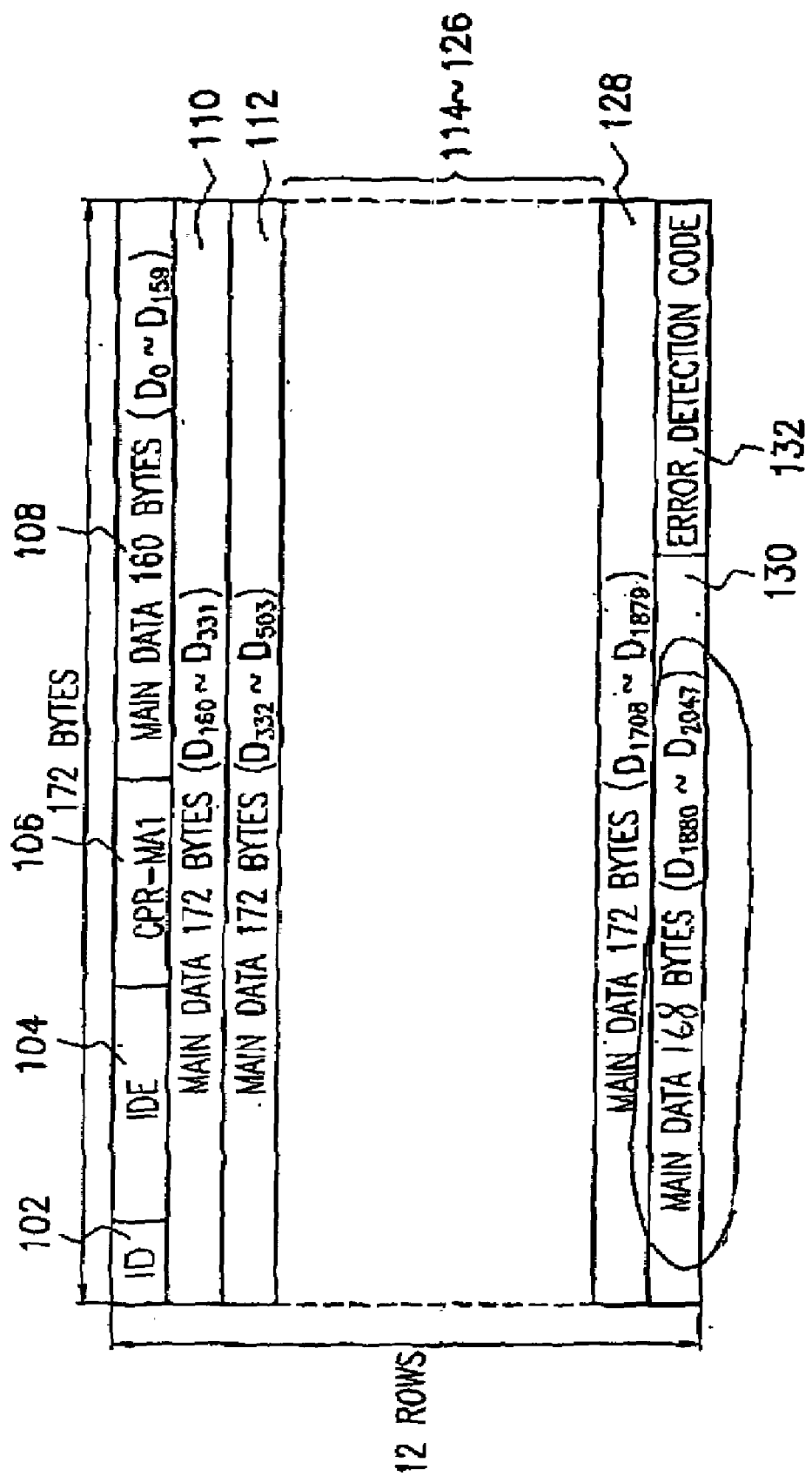
FIG. 1 shows the format of data storage in each data sector.
Figure 2C:
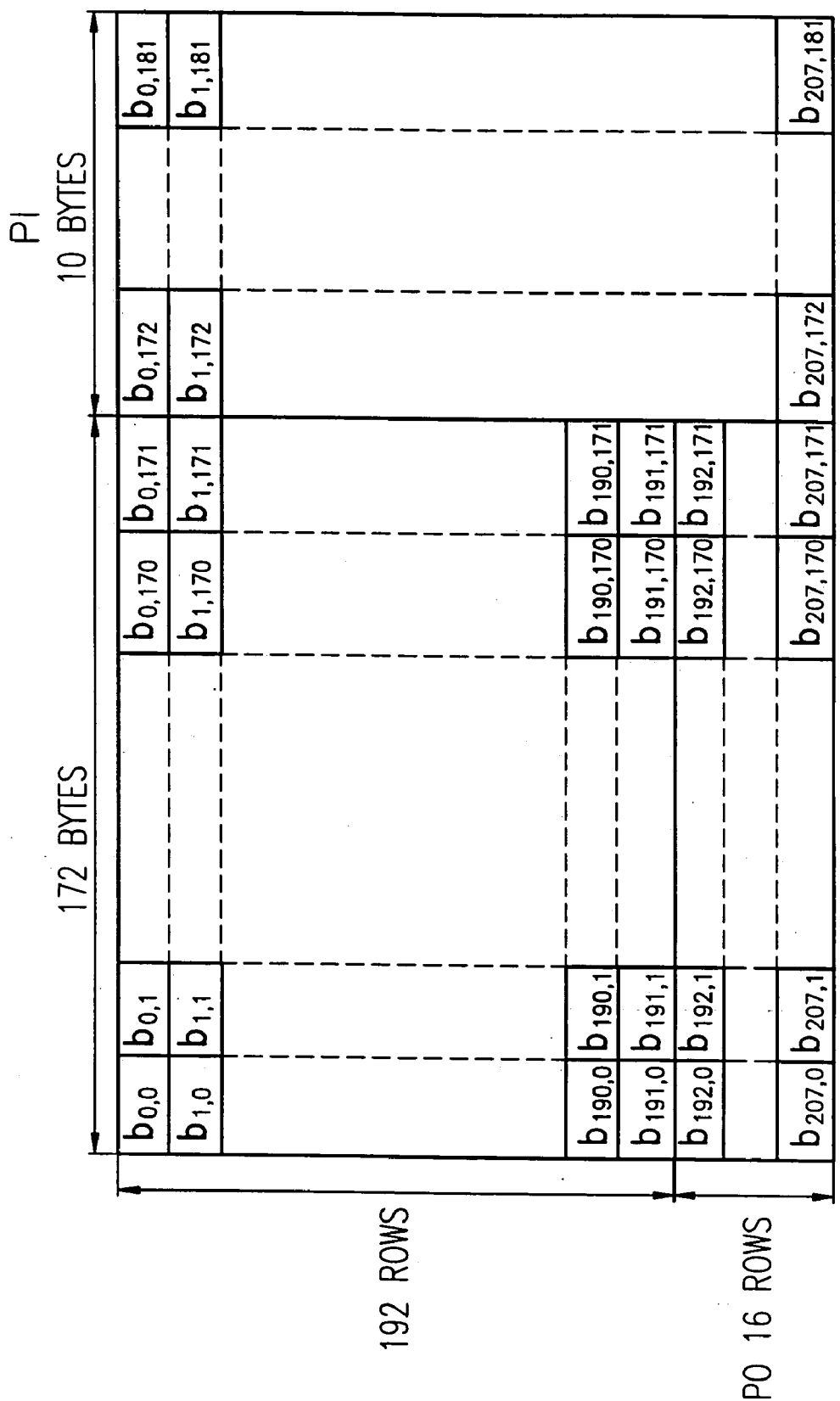
Figure 2D:
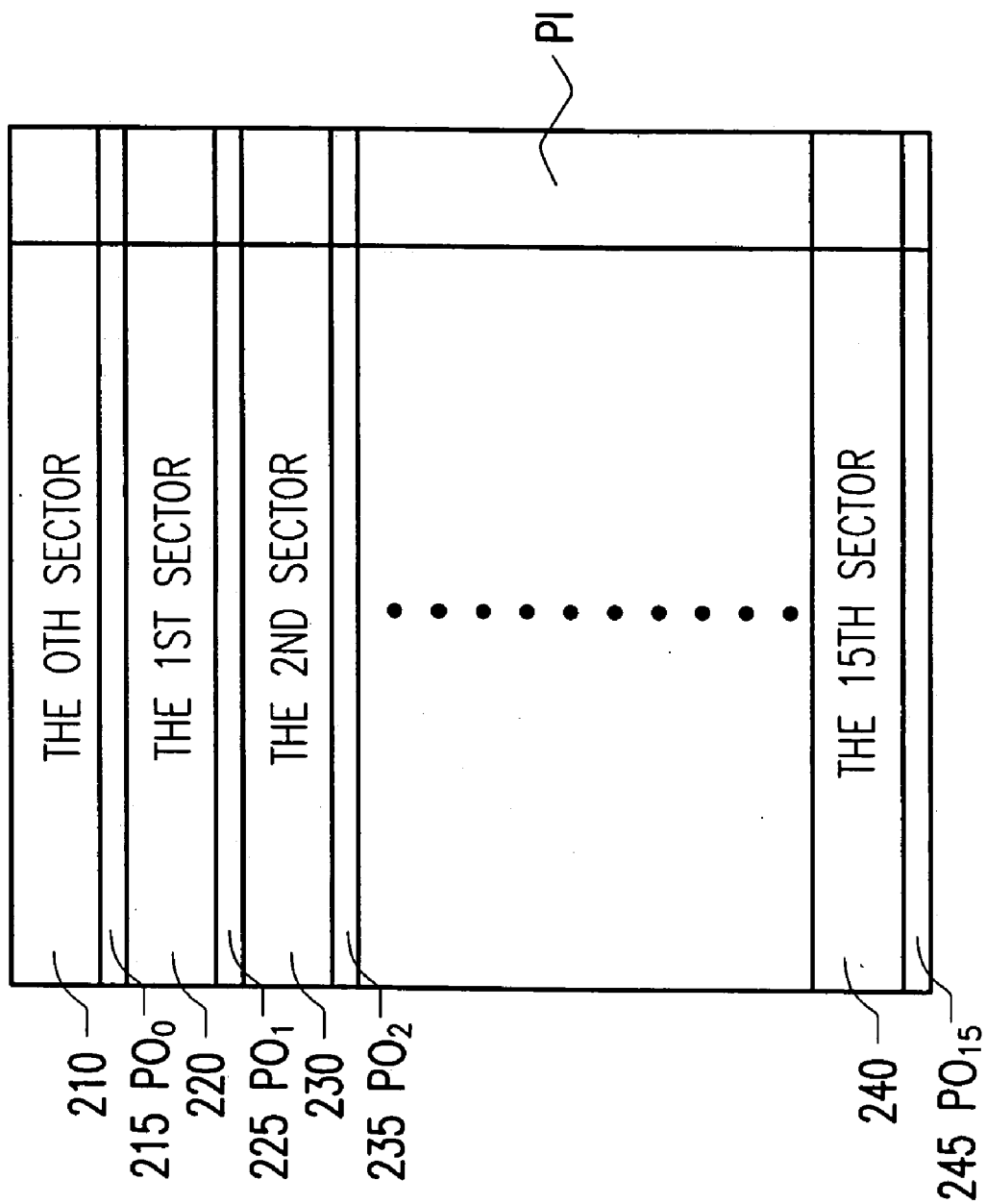
Figure 3A:
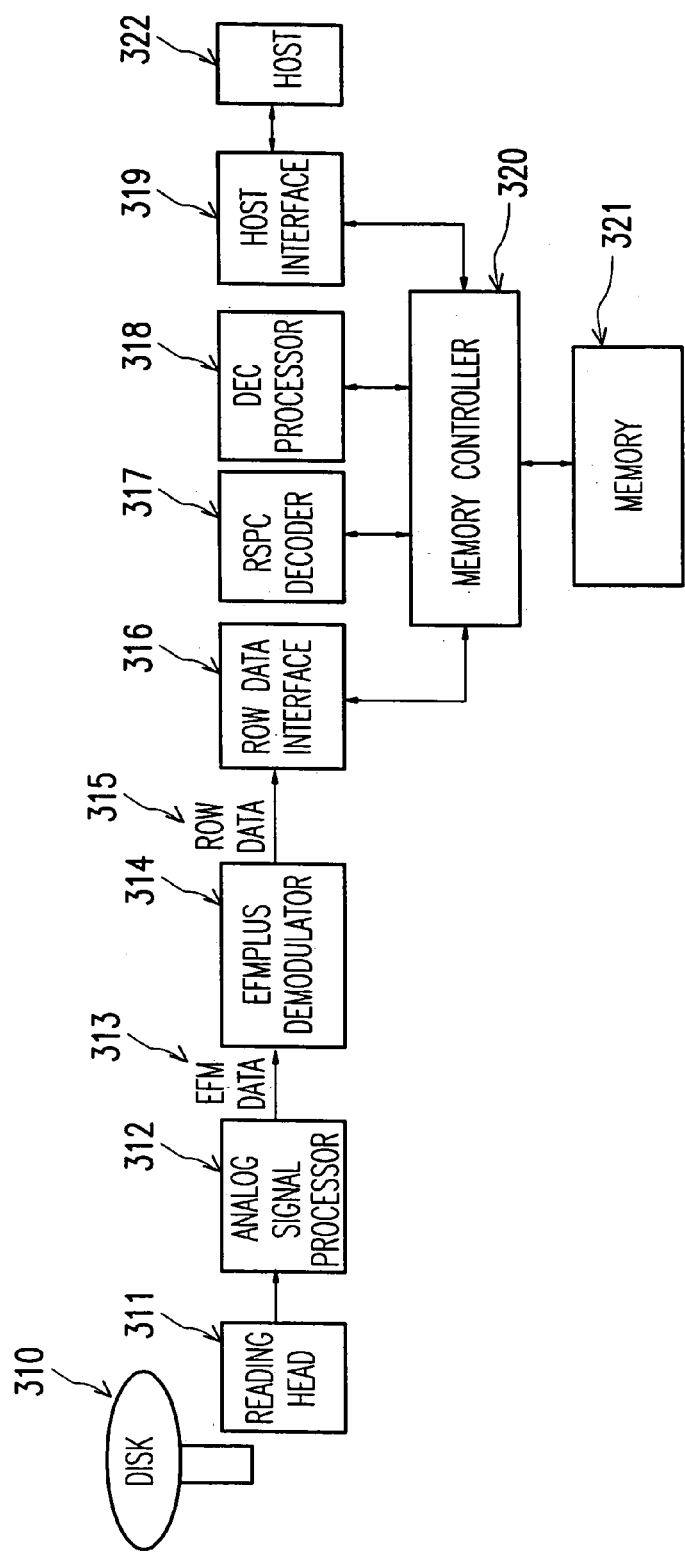
FIG. 3A shows a conventional hardware structure for accessing DVD data.
Figure 3B:
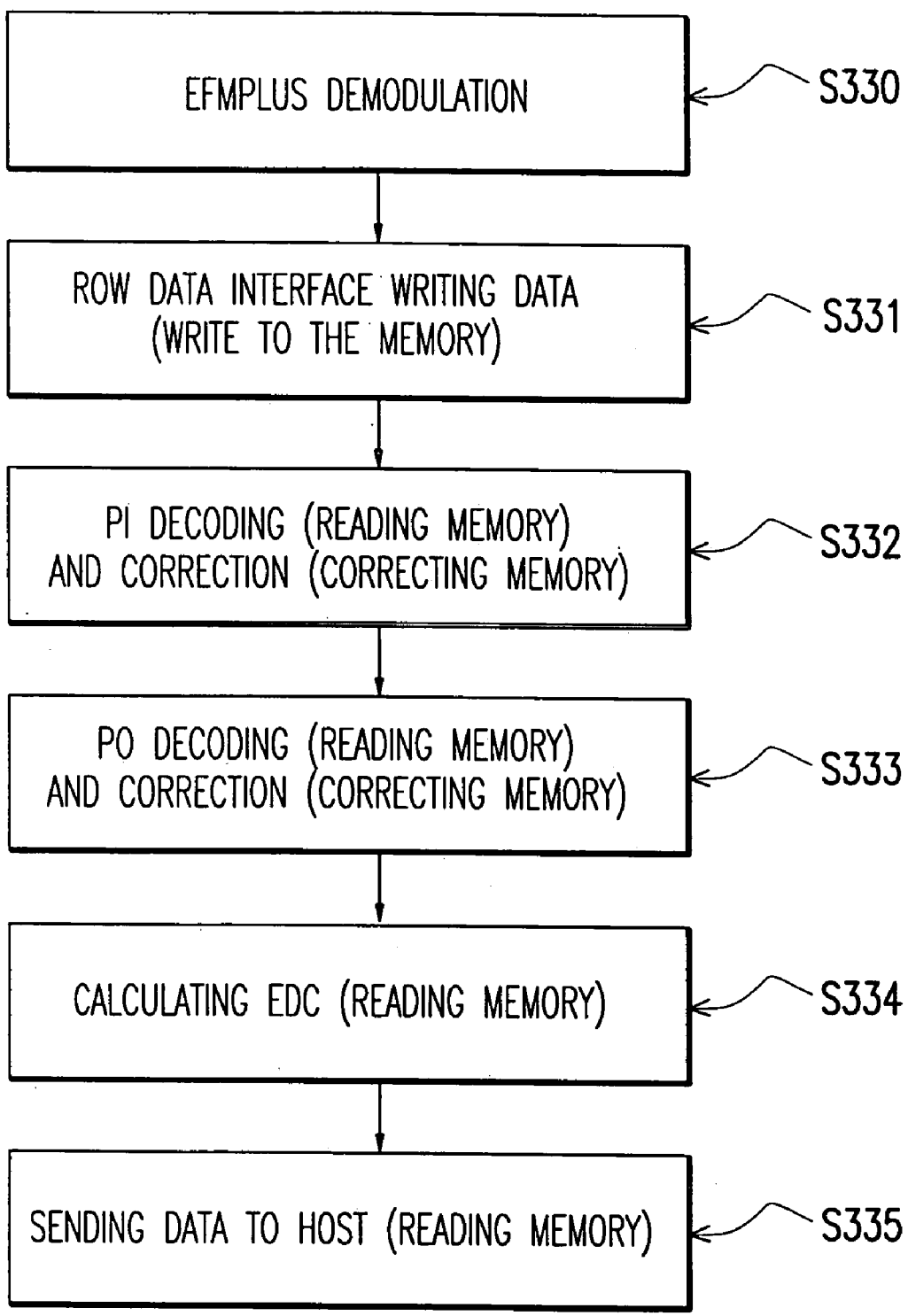
FIG. 3B shows a flow chart for accessing and decoding DVD data.

While performing a RSPC decoding step, to avoid correcting the data that is correct in a previous RSPC decoding step, if any error occurs after each outer-code parity decoding, and the error occurs at the data sector as shown in FIG. 2A, the result is treated as unreliable. The decoding result has to be abandoned without performing any correction.

As a summary, the invention comprises at least the advantages that the required data amount for accessing a memory is reduced. Therefore, the data accessing speed for DVD can be performed under a lower operation speed. In addition, the method to access the data is modified into a method that only decoding the part with errors, so that the efficiency for data access is enhanced.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. An apparatus for accessing data stored on an optical disc, comprising:

a row data interface, for receiving a demodulated row data from the optical disc;

a first buffer, for storing the row data from the row data interface;

a first decoder, for performing a first decoding to the row data stored in the first buffer and generating decoded data, wherein the decoded data is stored into a memory, the decoded data is also sent to an error detection code generator, the error detection code generator generates the error detection codes for the decoded data, the generated error detection codes are stored into the memory;

a second decoder, for reading the error detection codes from the memory, storing the error detection codes into a second buffer other than the memory, and performing a second decoding on the data stored in the memory when the data stored in the memory is sufficient to be assembled as a complete data block; and a host interface, for inspecting whether the error detection codes in the second buffer are correct or not, if correct, the data stored in the memory will be output to a host.

2. The apparatus of claim 1, wherein when the second decoder performing the second decoding on the data stored in the memory, if there are any errors occurring after the second decoding, the errors in the memory and in the second buffer are corrected accordingly.

3. The apparatus of claim 1, wherein the first buffer is located in an embedded memory.

4. The apparatus of claim 1, wherein the second buffer is located in an embedded memory.

5. The apparatus of claim 1, wherein the first buffer and the second buffer are located in an embedded memory.

6. The apparatus of claim 5, wherein the embedded memory is an SRAM.

* * * * *